United States Patent
Agrawal et al.

(10) Patent No.: US 6,507,524 B1
(45) Date of Patent: Jan. 14, 2003

(54) INTEGRATED CIRCUIT MEMORY HAVING COLUMN REDUNDANCY

(75) Inventors: Ghasi Agrawal, San Jose, CA (US); Thomas R. Wik, Livermore, CA (US)

(73) Assignee: LSI Logic Corporation, Milpitas, CA (US)

( * ) Notice: Subject to any disclaimer, the term of this patent is extended or adjusted under 35 U.S.C. 154(b) by 82 days.

(21) Appl. No.: 09/727,043

(22) Filed: Nov. 30, 2000

(51) Int. Cl.[7] ................................. G11C 7/00
(52) U.S. Cl. .............. 365/200; 365/230.02; 365/189.02
(58) Field of Search ................... 365/200, 230.02, 365/189.02, 189.05, 221, 189.08

(56) References Cited

U.S. PATENT DOCUMENTS

| | | | |
|---|---|---|---|
| 4,471,472 A | | 9/1984 | Young |
| 5,953,745 A | | 9/1999 | Lattimore et al. |
| 6,011,734 A | * | 1/2000 | Pappert ................. 365/195 |
| 6,151,259 A | * | 11/2000 | Hori ..................... 365/200 |
| 6,157,584 A | * | 12/2000 | Holst .................... 365/200 |
| 6,297,997 B1 | * | 10/2001 | Ohtani et al. .......... 365/201 |

* cited by examiner

Primary Examiner—David Nelms
Assistant Examiner—Thong Le
(74) Attorney, Agent, or Firm—Westman, Champlin & Kelly

(57) ABSTRACT

A memory array has memory elements arranged in rows and columns. Each column has a respective bit line. A plurality of bit line input-output nodes are each switchably coupled to either a respective one of the bit lines or another one of the bit lines.

17 Claims, 4 Drawing Sheets

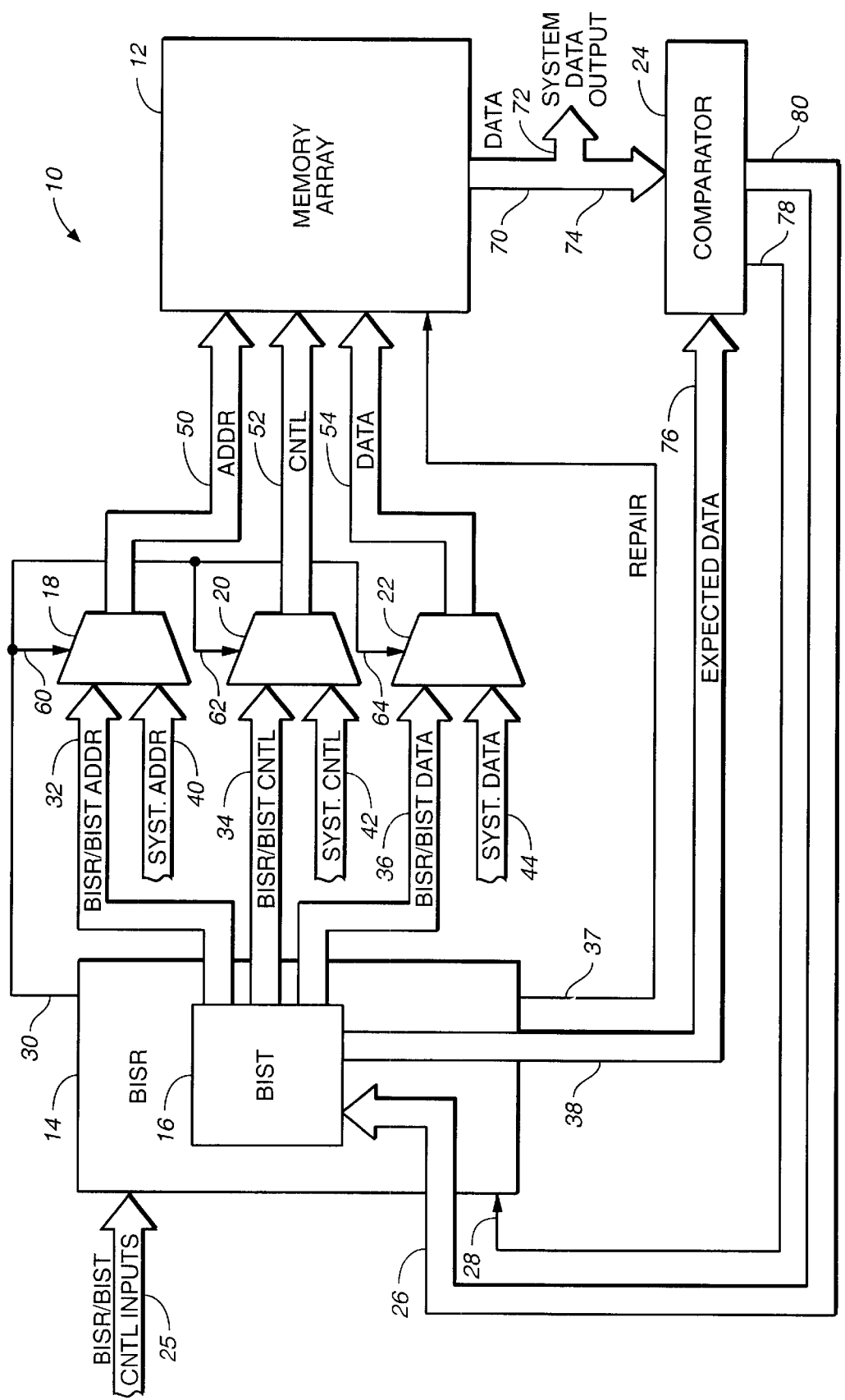
FIG._1

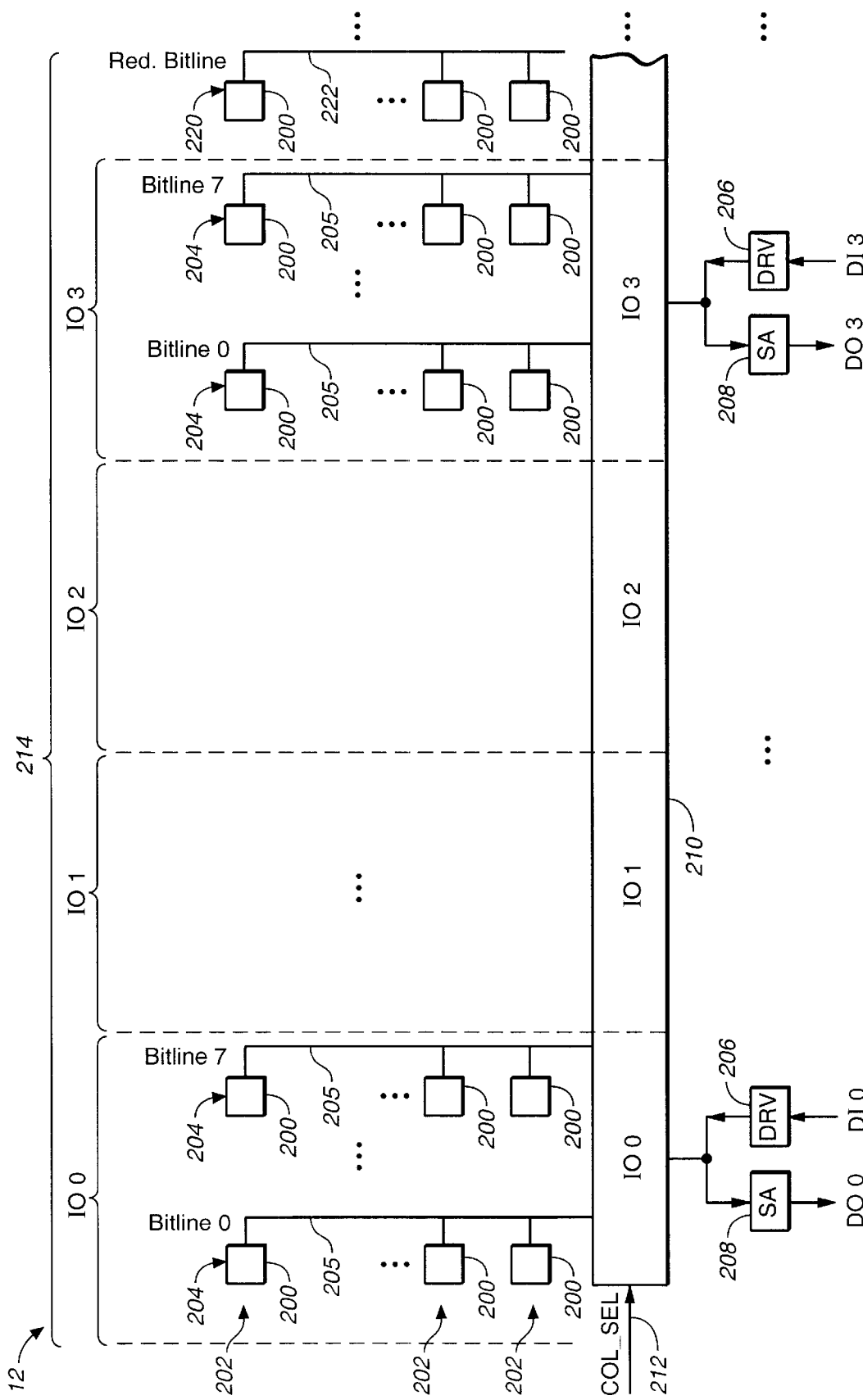
FIG._2

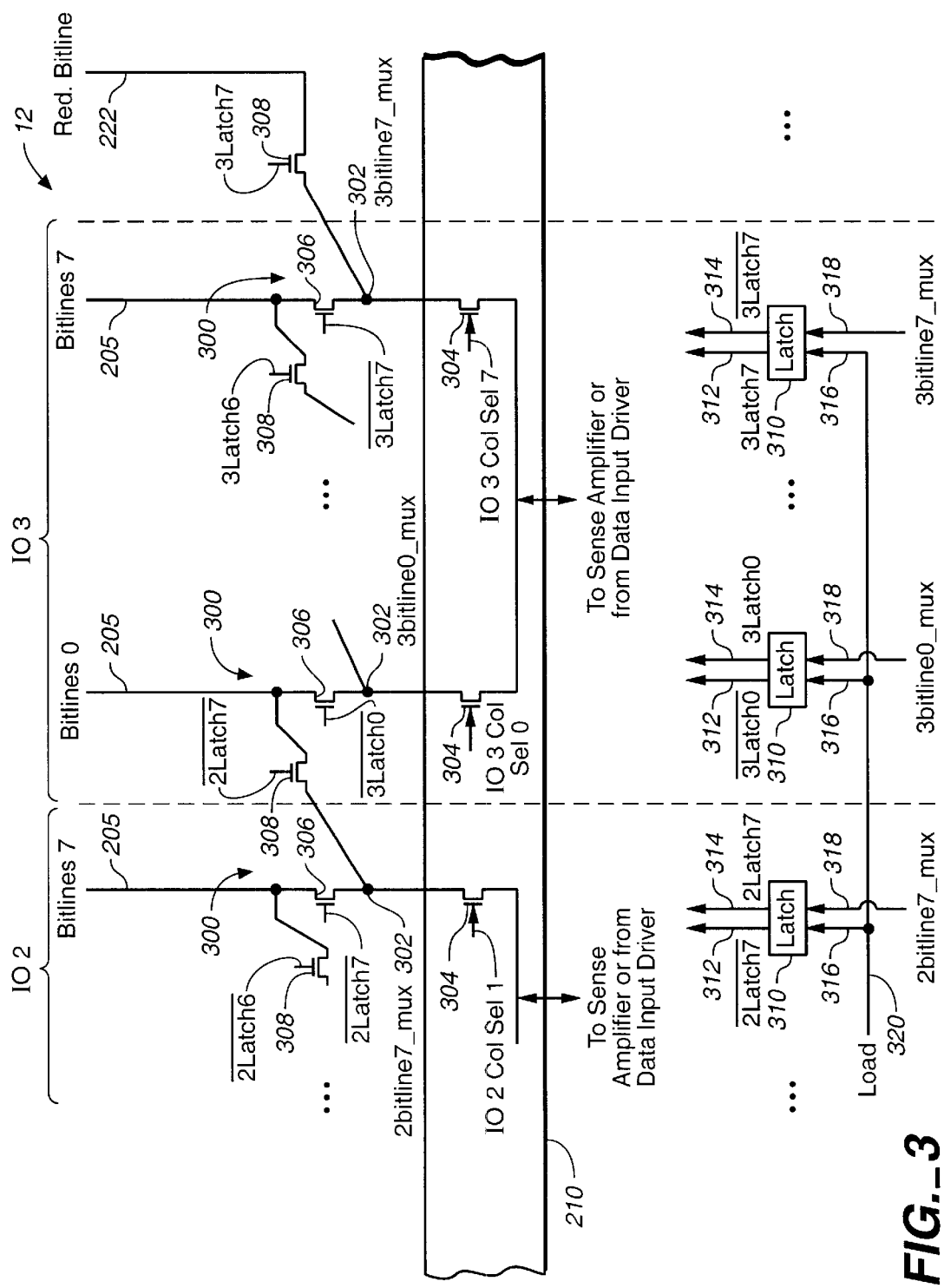
FIG._3

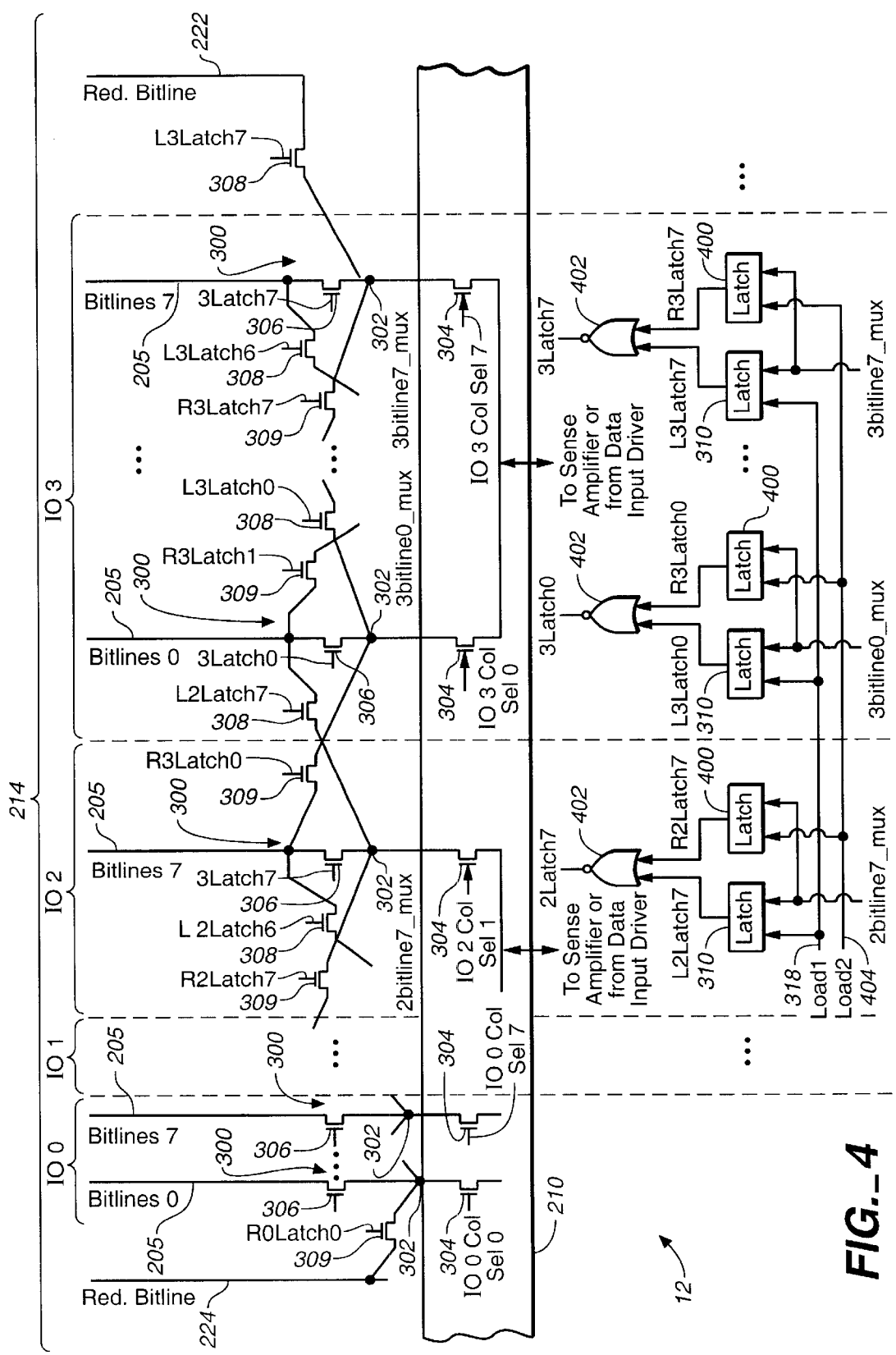
FIG._4

INTEGRATED CIRCUIT MEMORY HAVING COLUMN REDUNDANCY

BACKGROUND OF THE INVENTION

The present invention relates generally to integrated circuit memory devices. More particularly, the present invention relates to memories with redundancy.

Semiconductor integrated circuit memories such as static random access memories ("SRAMs") have used built-in self repair ("BISR") circuits to screen for and sometimes repair certain memory failures in the factory and in the field. BISR circuits typically include a state machine, which is fabricated on the integrated circuit with the memory array for implementing a selected test algorithm. This algorithm is initiated in the factory by an external memory tester. In the field, the algorithm is initiated on start-up.

The prevailing method for detecting faults in SRAMs that have BISR circuits is to screen for these faults in the factory. In the factory, the memory and associated BISR circuit are coupled to a memory tester, which provides a supply voltage and a system clock to the memory array and provides control signals to operate the BISR circuit. Typically, memory testers use a two-pass approach through the BISR circuit test algorithm. In the first pass, memory failures are detected and repaired. In the second pass, the repairs are verified.

A common BISR test algorithm consists of several runs through the memory array. The BISR test algorithm performs a sequence of writes and reads on each cell in the memory array, comparing the output of each read with expected data. When a discrepancy is detected, the BISR test algorithm re-maps the memory addresses to replace the row containing the failing cell with a redundant row. These repairs are verified in the second pass through the BISR test algorithm. If all errors in at least some of the failing memories can be repaired by using available redundant rows, then the overall manufacturing yield for the memory devices can be increased, which reduces manufacturing costs.

When the memory is installed in the field, the BISR test algorithm is initiated on start-up. Then, during normal operation of the memory array, typical existing systems employ an address matching circuit connected to the input addresses. Incoming addresses are compared against pre-programmed failing addresses on every access cycle. If the incoming address matches a failing address, a redundant memory element is utilized in place of the target memory element. The comparison has a significant timing impact on the system. The more address bits there are, the longer it takes to perform the comparison. Currently, a 10-bit address can take 2 ns (nanoseconds) or more to be matched.

A memory device is therefore desired that has redundancy with a reduced timing penalty associated with avoiding faulty memory cells and which results in further increasing manufacturing yield as compared to existing redundancy schemes.

SUMMARY OF THE INVENTION

One embodiment of the present invention is directed to a memory array having a zone of memory elements arranged in rows and columns. Each column in the zone has a respective bit line. A plurality of bit line input-output nodes are each switchably coupled to either a respective one of the bit lines in the zone or another one of the bit lines in the zone.

Another embodiment of the present invention is directed to a method of repairing a memory array having a plurality of rows and columns, wherein each column has a respective bit line and bit line input-output node. The method includes providing a redundant column having a redundant bit line and identifying one of the columns as a defective column. The bit lines of the defective column and all columns positioned between the defective column and the first redundant column are decoupled from their respective bit line input-output nodes. The bit line input-output nodes of the defective column and the columns positioned between the defective column and the redundant column are coupled to the bit lines of the columns adjacent to the respective columns in a direction toward the redundant column. The bit line input-output node of the column positioned adjacent to the redundant column is coupled to the first redundant bit line.

Another embodiment of the present invention is directed to a memory system for replacing defective memory elements. The memory system includes a memory array having a plurality of memory elements arranged in rows and columns, wherein each column has a respective bit line and each bit line has a respective bit line input-output node. A repair circuit decouples a selected one of the bit lines from its respective bit line input-output node and shifts another of the bit lines from its respective input-output node to the input-output node of the selected bit line.

BRIEF DESCRIPTION OF THE DRAWINGS

FIG. 1 is a block diagram of an integrated circuit memory having a built-in self repair (BISR) circuit according to an illustrative embodiment of the present invention.

FIG. 2 is a fragmentary, schematic diagram which illustrates the rows and columns within the memory in greater detail.

FIG. 3 is a fragmentary, schematic diagram which illustrates shifting of bitlines within the memory in greater detail.

FIG. 4 is a fragmentary, schematic diagram which illustrates an alternative embodiment of the present invention in which the memory is capable of repairing two failures per zone.

DETAILED DESCRIPTION OF ILLUSTRATIVE EMBODIMENTS

FIG. 1 is a block diagram of an integrated circuit 10 having a memory array 12 and a built-in self repair (BISR) circuit 14, according to one embodiment of the present invention. Memory array 12 can include a static random access memory (SRAM), for example, or any other type of memory in which column redundancy is useful. BISR circuit 14 includes a built-in-self-test (BIST) circuit 16 and surrounding support circuitry for testing and potentially repairing memory array 12. This support circuitry includes multiplexers 18, 20 and 22, comparator 24 and circuitry internal to memory array 12. In one embodiment, BIST circuit 16 is adapted to test the memory elements within memory array 12 and identify any columns in memory array 12 in which a failure has occurred. BISR circuit 14 then attempts to repair the defect by shifting bit lines within memory array 12 to remove the defective columns and insert redundant columns, as described in more detail below.

BISR circuit 14 includes control inputs 25, comparison inputs 26, error input 28, test/repair mode control output 30, address output 32, control output 34, data output 36, repair control output 37 and expected data output 38. Individual inputs and outputs of BISR circuit 14 can be received or driven by either BISR circuit 14 or BIST circuit 16, depending on the particular implementation of the lo circuits and the test and repair algorithm implemented by the circuits. Also, these inputs and outputs can be received or driven by different elements during different stages of the algorithm.

Address output 32, control output 34 and data output 36 are coupled to the first of two data inputs of multiplexers 18, 20 and 22, respectively. When BIST circuit 16 is enabled and in a test mode, these outputs provide the address, control and data signals for testing memory array 12. Repair control output 37 is coupled directly to memory array 12 for controlling repairs within the memory array. The second data inputs of multiplexers 18, 20 and 22 are coupled to system address input 40, system control input 42 and system data input 44, which provide the address, control and data to memory array 12 during normal operation. These inputs are driven by input pins of integrated circuit 10 or other circuitry (not shown) on integrated circuit 10. The outputs of multiplexers 18, 20 and 22 are coupled to address input 50, control input 52 and data input 54, respectively, of memory array 12. BISR circuit 14 controls which of the address, data and control signals are applied to memory array 12 through the test/repair mode control output 30, which is coupled to select inputs 60, 62 and 64 of multiplexers 18, 20 and 22.

Memory array 12 has a data output 70, which is coupled to system output 72 and to a first comparison input 74 of comparator 24. A second comparison input 76 of comparator 24 is coupled to expected data output 38 of BISR circuit 14, which is provided by BIST circuit 16. Comparator 24 has an error output 78, which is coupled to error input 28 of BISR circuit 14. Error output 78 indicates whether there is an error in any one of the data bits received from memory array 12 as compared to the expected data bits received from BIST circuit 16. Comparator 24 further includes individual comparison outputs 80, which reflect bit-by-bit comparisons between the data received from memory array 12 and the expected data received from BIST circuit 16. Comparison outputs 80 assist BIST circuit 16 in determining which, if any, of the columns in memory array 12 contain a defect. Comparison outputs 80 are coupled to input 26 of BISR circuit 14, which is provided to BIST circuit 16.

As mentioned above, multiplexers 18, 20 and 22 control whether memory array 12 is operated by external system circuitry or by BISR circuit 14 and BIST circuit 16. During normal operation, BISR circuit 14 and BIST circuit 16 are inactive, and BISR circuit 14 controls multiplexers 18, 20 and 22 to couple system address input 40, system control input 42 and system data input 44 to memory array 12 for accessing selected memory locations.

In the test mode, BISR circuit 16 controls multiplexers 18, 20 and 22 to couple address output 32, control output 34 and data output 36 to memory array 12. BIST circuit 16 controls outputs 32, 34 and 36 to perform a sequence of writes and reads on memory array 12. The test algorithm sequences through each address location of memory array 12 and performs several write and read operations at each location. For example, the test algorithm can initially write a test pattern to memory array 12, such that each memory cell has a definite state. The test algorithm then reads the stored data (i.e., logic state) from each memory cell, writes the opposite state to the memory cell and then reads the stored, opposite state from the memory cell.

As each cell or address location is read, comparator 24 compares the data that was read with expected data provided by BIST circuit 16 on output 38. If the data that was read from memory array 12 does not match the expected data, comparator 24 activates error output 78. Individual comparison outputs 80 indicate the particular data bit containing the error. This can be used by BIST circuit 16 to identify the corresponding column in memory array 12 causing the error. When error output 78 is active, BIST circuit 16 logs the error and the states of individual comparison outputs 80. The test algorithm then moves on to the next cell or address location in the array. The test algorithm can run through the addressed locations in memory array 12 multiple times and in various orders, with multiple test patterns being written to and read from the array. This type of test algorithm is commonly referred to as a march-type test algorithm.

BIST circuit 16 can include a state machine or finite controlled system, for example, which implements a built-in self test algorithm for testing each cell of memory array 12. In one embodiment, BIST circuit 16 includes a finite controlled system similar to the commercially available RAM BISTs provided by LSI Logic Corporation of Milpitas, Calif. or LogicVision, Inc, of San Jose, Calif., for example. Other circuits either hard-wired or driven by software can be used to implement a desired test algorithm.

When memory array 12 contains a faulty memory location, BIST circuit 16 activates the repair function within BISR circuit 14. The faulty memory locations can be repaired as faults are detected or after all memory locations have been tested by BIST circuit 16. As explained in more detail below, BISR circuit 14 attempts repairs on the faulty memory locations by selectively shifting bit lines within memory array 12 to avoid the defective columns. In one embodiment, the repair circuitry for shifting the selected bit lines within memory array 12 is accessed through the same address, control and data outputs used by BIST circuit 16 and through repair control output 37. In another embodiment (not shown), the repair circuitry is accessed through separate signals passed directly to memory array 12.

FIG. 2 is a schematic diagram which illustrates the rows and columns within memory array 12 in greater detail. Memory array 12 includes a plurality of memory elements 200, which are arranged in a plurality of rows 202 and columns 204. In one embodiment, memory array 12 has 128 physical rows 202 and 1024 physical columns 204. However, any number of rows and columns can be used in alternative embodiments. The memory elements 200 in each column 204 are coupled to a respective bitline 205. For simplicity, only one bitline 205 for each column 204 is shown in FIG. 2. However, multiple bitlines can be used for each column, such as a pair of complementary bitlines.

Memory 12 has a column multiplexer 210, for multiplexing groups of bitlines 205 into a respective data input-output bit. In the embodiment shown in FIG. 2, column multiplexer 210 is configured as an 8:1 multiplexer. However, other configurations can also be used such as 4:1, 16:1 and 32:1. With an 8:1 multiplexer configuration and 1024 physical columns, there are 128 data inputs, "DI0–DI127", and 128 data outputs, "DO0–DO127". For simplicity, only DI0, DI3, DO0 and DO3 are shown in FIG. 2. Each data input is coupled to a respective bitline driver 206, and each data output is coupled to a respective sense amplifier 208. Each bitline driver and sense amplifier pair is coupled to a respective data input-output "IO0–IO127" (IO4–IO127 not shown) of column multiplexer 210. With an 8:1 column multiplexer, bitlines 205 are grouped in sets of eight, with each set being labeled IO0–IO127 (IO4–IO127 not shown) to correspond to the respective data input-output of column multiplexer 210. Within each set, bitlines 205 are labeled "bitline 0" to "bitline 7". For each set of bitlines, column multiplexer 210 couples a respective one of the bitlines 0–7 to the respective bitline driver 206 and sense amplifier 208, as a function of one or more column select inputs, Col_Sel, provided on select input 210.

To support the repair function of BISR circuit 14 (shown in FIG. 1) memory array 12 further includes one or more redundant columns 220 of memory elements 200. Each redundant column 220 has a respective redundant bitline 222. BISR circuit 14 can repair either one or two defects per zone, with a zone being defined as a selected number, N, of physical columns. In the embodiment shown in FIG. 2, there are 32 zones 214, with each zone having 32 physical columns 205 and one redundant column 220. The number of physical columns in each zone can be set based on the yield requirements of memory array 12 and the acceptable area penalty that can be occurred through the introduction of redundant columns. Redundant column 220 can be positioned at the right end or the left end of each zone 214.

In the event that one of the non-redundant columns 204 contains a memory element that is defective, BISR circuit 14 removes the defective column by decoupling the respective bitline 205 from column multiplexer 210 and shifting the bitlines 205 that are located between the defective bitline and redundant bitline 222 to the left along column multiplexer 210 by one bitline position. Redundant bitline 222 is then coupled to column multiplexer 210 at the end of zone 214. The shifting of bitlines effectively removes the defective column from memory array 12.

FIG. 3 is a schematic diagram which illustrates the shifting of bitlines in greater detail. For simplicity, only a portion of column sets IO2 and IO3 is shown. Each bitline 205 is coupled to a respective bitline input-output node 302 through a switch circuit 300. Column multiplexer 210 has a plurality of N-channel transistor switches 304 for multiplexing the columns 205 in each set IO0–IO127 (IO0, IO1 and IO4–IO127 not shown) to the respective bit line driver 206 and sense amplifier 208 pair (shown in FIG. 2). Each switch 304 is coupled between the respective bitline input-output node 302 and the respective bit line driver 206 and sense amplifier 208 pair. Thus, the bitline input-output nodes 302 for the bitlines 205 in set IO2 are labeled "2bitline0_mux" to 2bitline7_mux, and the bitline input-output nodes 302 in set IO3 are labeled "3bitline0_mux" to 3bitline7_mux. The control terminals of switches 304 are coupled to respective column select signals within multiplexer 210. For example, the switch 304 corresponding to bitline 7 of IO2 has a control terminal coupled to column select signal "IO2 Col Sel 7". The switch 304 corresponding to bitline 0 of IO3 has a control terminal coupled to column select signal "IO3 Col Sel 0". The switch 304 corresponding to bitline 7 of IO3 has a control terminal coupled to column select signal "IO3 Col Sel 7".

Each switch circuit 300 includes an N-channel transistor switch 306 and an N-channel transistor switch 308. Switch 306 selectively couples bitline input-output node 302 to the respective bitline 205. Switch 308 selectively couples bitline input-output node 302 to the bitline 205 that is adjacent to the respective bitline 205 in a direction toward redundant bitline 220. Based on the states of switches 306 and 308, each bitline input-output node 302 is coupled to either its respective bitline or the bitline immediately adjacent to its respective bitline in the direction of redundant column 222. Although N-channel shifting transistors have been shown, other types of transistors or switches can also be used, including P-channel transistors.

The states of switches 306 and 308 in each switching circuit 300 are controlled by a respective latch 310. There is one latch 310 for each physical column in memory 12. Each latch 310 has a pair of complementary data outputs 312 and 314, which are coupled to the control terminals of the respective switches 306 and 308. For example, the latch 310 that corresponds to bitline 7 of IO2 has outputs 312 and 314 labeled "2LATCH7" and "2LATCH7", which are coupled to the control terminals of switches 306 and 308, respectively, of the switching circuit 300 for bitline 7 in IO2. The outputs 312 and 314 of the remaining latches 310 are coupled to their respective switch circuits 300 in a similar manner. Depending on the logic state stored in each latch 310, one of the switches 306 and 308 of each switch circuit 300 will be open and the other will be closed.

Each latch 310 further includes a latch load control input 316 and a data input 318. The latch load control input 316 is coupled to load input 320. In one embodiment, load input 320 is coupled to repair control output 37 (shown in FIG. 1) of BISR circuit 14. Data input 318 is coupled to the respective bitline input-output node 302 for that latch. For example, data input 318 of the latch corresponding to bitline 7 of IO2 is coupled to the bitline input-output node 302 labeled "2bitline7_mux". Thus, the data input 318 of each latch 310 is coupled to a respective output of column multiplexer 210. Once BIST circuit 16 has identified a column having a defective memory cell, BISR circuit 14 can load latches 310 with the desired states through data inputs DI0–DI127 and column multiplexer 210. Separate addressing circuitry for latches 310 is not required. With an 8:1 column multiplexer, only eight writing operations are required for setting the states of all of the latches 310 so that the defective column can be replaced.

For example, if a defect occurs in column 7 of IO2, this column is replaced by opening the switch 306 that is coupled between bitline 7 in IO2 and the bitline input-output node 302 labeled 2bitline7_mux and by closing the switch 308 that is coupled between 2bitline7_mux and bitline 0 in IO3. This shifts the bitline input-output node 302 for bitline 7 in IO2 to bitline 0 in IO3 such that column 7 in IO2 is replaced with column 0 in IO3. Similarly, each remaining bitline input-output node 302 positioned between the defective bitline 7 in IO2 and the redundant bitline 222 is decoupled from its respective bitline and coupled to the bitline immediately adjacent to the respective bitline in the direction toward redundant bit line 222. Finally, redundant bit line 222 is coupled to the bitline input-output node 302 corresponding to bitline 7 in IO3, which is labeled "3bitline7_mux". The states of the switches 306 and 308 to the left of the defective bitline are unchanged.

For each failure identified by BIST circuit 16, BISR circuit 14 converts the bit map failure information into an IO address and a column address. For example, if there is a failure on IO2, as discussed above, the corresponding binary address would be "010". If the memory array contains more than one word per row, then BISR circuit 14 stores the corresponding column address. For example, in a case of an 8:1 column multiplexer, memory array 12 would have eight words per row, and the failure can be located in any of the eight columns of a word.

The IO addresses can be coded per zone 214 or can be coded for the whole memory array 12. By coding IO addresses per zone, only one failure per zone needs to be coded. If the IO addresses are coded in terms of the whole memory, then there may be more than one failure and all failures would need to be coded. All columns in the memory array would need to be addressed uniquely and this would add to the coding complexity. For example, an IO address for a memory having a maximum of 1024 physical columns would need 10 address bits. If the memory has an 8:1 column multiplexer, then three address bits would be needed to identify which of the eight columns had a failure, and seven bits would be needed to identify which of the 128 IOs contained the failure. An additional difficulty in coding IO addresses in terms of the whole memory is that the number of address bits for identifying the column and the IO containing a failure would be dependent on the particular column multiplexer option selected for that memory, which can vary from one application to the next. The total number of address bits would remain the same at 10.

Table 1 shows the number of IO and column address bits required for various column multiplexer options for a memory having a maximum of 1024 physical columns. This table can be modified for any number of maximum physical columns within a memory.

TABLE 1

| Column Mux | Number of IOs/Number of IO address bits | Number of Column address bits |
|---|---|---|
| 4:1 | 256/8 | 2 |
| 8:1 | 128/7 | 3 |
| 16:1 | 64/6 | 4 |
| 32:1 | 32/5 | 5 |

In the above example, if the IO addresses are coded per zone, then a total of only six address bits would be required. With 32 physical columns per zone, five address bits would be required to identify each IO and column within a particular zone, and one address bit would be required to identify whether there was a failure in that zone. Table 2 shows the number of IO and column address bits required for various combinations of column multiplexer options. Again, the table can be modified to support different numbers of physical columns within a zone.

TABLE 2

| Column Mux | Number of IOs in each zone | Number of address bits for IOs | Number of address bits for columns | Total number of bits |
|---|---|---|---|---|
| 4:1 | 8 | 3 | 2 | 5 + 1 for repair info |
| 8:1 | 4 | 2 | 3 | 5 + 1 for repair info |
| 16:1 | 2 | 1 | 4 | 5 + 1 for repair info |
| 32:1 | 1 | 0 | 5 | 5 + 1 for repair info |

With an 8:1 column multiplexer, there are four IOs in each zone. With four IOs in each zone, two address bits are required to identify an IO in any particular zone. With eight columns in each IO, three address bits are required to identify the column in that IO. Thus, a total of five address bits are required to identify the IO and column, and one address bit is required to identify whether there is a failure in each zone. In one embodiment, each defective column is identified by a digital code value with the above-bit fields, which indicate whether the zone has a defective column, identify the IO containing the defective column and identify the column in the IO that is the defective column. Based on this code value, BISR circuit 14 can determine which latches need to be loaded with new values.

During the repair operation, BISR circuit 14 would cycle through each column multiplexer selection to set the latches for each column. For example, in the embodiment shown in FIG. 3, BISR circuit 14 would set the latches to "1", starting from the defective column to the last column within a zone for a single column repair.

FIG. 4 is a schematic diagram which illustrates an alternative embodiment of the present invention in which memory array 12 is capable of repairing two failures per zone. The same reference numerals are used in FIG. 4 as were used in FIG. 3 for same or similar elements. Memory array 12 further includes a second redundant bitline 224 positioned on the opposite end of each zone 214 than redundant bitline 222. Each switching circuit 300 further includes a switch 309 coupled between each bitline input-output node 302 and the bitline 205 that is adjacent to the respective bitline 205 in a direction toward redundant bitline 224. Switches 309 allow each bitline input-output node 302 to be selectively coupled to the next adjacent bitline 205 in the direction toward redundant bit line 224.

If a zone contains two columns containing faulty memory cells, then switches 306, 308 and 309 are used to selectively shift the bitlines in memory array 12 to avoid the two defective columns. For example, if column 7 in IO2 and column 0 in IO3 are defective, then defective bitline 7 in IO2 and all the bitlines to the left of the defective bitline in zone 214 are decoupled from their respective bitline input-output nodes 302. Similarly, defective bitline 0 in IO3 and all the bitlines to the right of the defective bitline in zone 214 are decoupled from their respective bitline input-output nodes 302. The bitline input-output node 302 for the defective bitline 7 in IO2 and the bitline input-output nodes 302 for all bitlines between the defective bitline and redundant bit line 224 are coupled to the next adjacent bitline in a direction toward redundant bitline 224 through switches 309. Similarly, the bitline input-output node 302 for the defective bitline 0 in IO3 and the bitline input-output nodes 302 for all bitlines between the defective bitline and redundant bit line 222 are coupled to the next adjacent bitline in a direction toward redundant bitline 222 through switches 308.

In order to repair two bitlines per zone, each switching circuit 300 is controlled by two independent latches. As in the embodiment shown in FIG. 3, switches 306 and 308 are controlled by an output of a respective latch 310. In addition, switches 306 and 309 are controlled by the output of a respective latch 400. The outputs of latches 310 and 400 are combined through NOR gate 402 to control decoupling switch 306. If the output of either latch 310 or 400 is active, the respective decoupling transistor 306 is opened to decouple the bitline from its respective bitline input-output node 302. Latches 400 can be loaded through column multiplexer 200 in a similar manner as latches 310. However, a separate load control signal 404 is used to set latches 400.

With the above-described column redundancy scheme having one or two redundant columns per zone, defects can be easily repaired by replacing the column or columns containing the defect. With this type of repair, there is virtually no timing penalty associated with the repair, except for the addition of one transistor delay through each bitline. Since the voltage swing on each bitline is less than 200 mV, the extra delay would be very small as compared to the total memory access or cycle time. In addition, it is generally found that defects occur in pairs. The above-described redundancy scheme provides the ability to repair such defect pairs within a zone. The column redundancy scheme also gives the flexibility of selecting the number of columns per zone. This way, the amount of area penalty associated with the redundant columns can be controlled. The BISR logic itself is not complex and the total power-up cycle time required to load the latches is very small.

It is to be understood that even though numerous characteristics and advantages of various embodiments of the present invention have been set forth in the foregoing description, together with details of the structure and function of various embodiments of the invention, this disclosure is illustrative only, and changes may be made in details, especially in matters of structure and arrangement of parts within the principles of the present invention to the full extent indicated by the broad general meaning of the terms in which the appended claims are expressed. For example, the column redundancy scheme of the present invention has been described with respect to a single-port memory. However, the scheme can be applied to multi-port memories or any other type of memory in which column redundancy can be used. Also, any suitable type of switch can be used for shifting the bitlines, and the bitlines can be shifted to adjacent or non-adjacent columns.

What is claimed is:

1. A memory array comprising:
   a plurality of data inputs-outputs;
   a first zone of memory elements arranged in rows and columns, wherein each column in the first zone has a respective bit line, the columns in the first zone are arranged in a plurality of input-output sets, and the respective bit line input-output nodes of each set are multiplexed into a respective one of the data inputs-outputs; and
   a plurality of bit line input-output nodes which are each switchably coupled to either a respective one of the bit lines in the first zone or another one of the bit lines in the first zone, wherein at least one of the bit line input-output nodes is switchably coupled to either a respective one of the bit lines in one of the input-output sets or another of the bit lines in another one of the input-output sets.

2. The memory array of claim 1 and further comprising:
   a first redundant column of memory elements having a first redundant bit line; and
   wherein one of the bit line input-output nodes is switchably coupled to either the respective bit line or the first redundant bit line.

3. The memory array of claim 2 and further comprising a switching circuit for each of the columns in the first zone, wherein each switching circuit comprises:
   a first switch coupled in series between the respective bit line input-output node and the respective bit line of the corresponding column; and
   a second switch coupled in series between the respective bit line input-output node and the bit line that is adjacent to the respective bit line in a direction toward the first redundant bit line.

4. The memory array of claim 2 and further comprising:
   a second redundant column of memory elements having a second redundant bit line, wherein the first and second redundant columns are positioned at opposite ends of the columns in the first zone; and
   wherein one of the bit line input-output nodes is switchably coupled to either the respective bit line or the second redundant bit line.

5. The memory array of claim 1 and further comprising:
   a plurality of zones, including the first zone, wherein each zone comprises memory elements arranged in rows and columns;
   wherein each column has a respective bit line and a respective bit line input-output node; and
   wherein, within each zone, each bit line input-output node is switchably coupled to either the respective bit line or another one of the bit lines in that zone.

6. A memory system for replacing defective memory elements, the memory system comprising:
   a memory array including a plurality of memory elements arranged in rows and columns, wherein each column has a respective bit line and each bit line has a respective bit line input-output node, and including a redundant column having a redundant bit line; and
   means for decoupling a selected one of the bit lines from its respective bit line input-output node, decoupling each of the bit lines positioned between the selected bit line and the redundant bit line from its respective bit line input-output node, coupling each of the bit lines positioned between the selected bit line and the redundant bit line to the next adjacent bit line input-output node in a direction toward the selected column, and coupling the redundant bit line to the next adjacent bit line input-output node in the direction toward the selected column.

7. The memory system of claim 6 wherein the means for decoupling comprises a switching circuit for each of the columns, wherein each switching circuit comprises:
   a first switch coupled in series between the respective bit line input-output node and the respective bit line for the corresponding column; and
   a second switch coupled in series between the respective bit line input-output node for the corresponding column and the bit line that is adjacent to the respective bit line in a direction toward the redundant bit line.

8. The memory system of claim 7 wherein each switching circuit further comprises:
   a respective latch having a data output coupled to switch control terminals of the first and second switches in that switching circuit.

9. The memory system of claim 6 wherein:
   the memory array further comprises a plurality of zones, wherein each zone comprises a plurality of the columns and comprises first and second redundant columns which are positioned at opposite ends of the zone;
   the means for decoupling comprises, for each zone, means for decoupling a first selected bit line and each of the bit lines positioned between the first selected bit line and the first redundant bit line from its respective bit line input-output node, for coupling each of the bit lines positioned between the first selected bit line and the first redundant bit line to the next adjacent bit line input-output node in a direction toward the first selected column and for coupling the first redundant bit line to the next adjacent bit line input-output node in the direction toward the first selected column; and
   the means for decoupling comprises, for each zone, means for decoupling a second selected bit line and each of the bit lines positioned between the second selected bit line and the second redundant bit line from its respective bit line input-output node, for coupling each of the bit lines positioned between the second selected bit line and the second redundant bit line to the next adjacent bit line input-output node in a direction toward the second selected column and for coupling the second redundant bit line to the next adjacent bit line input-output node in the direction toward the second selected column.

10. A method of repairing a memory array having a plurality of rows and columns, wherein each column has a respective bit line and bit line input-output node, the method comprising:
    (a) providing a redundant column having a redundant bit line;

(b) identifying one of the columns as a defective column;

(c) decoupling the bit lines of the defective column and all columns positioned between the defective column and the redundant column from the respective bit line input-output nodes, wherein one of the columns with decoupled bit lines is adjacent the redundant column; and (d) coupling the bit line input-output nodes of the defective column and the columns positioned between the defective column and the redundant column to the bit lines of the columns adjacent to the respective columns in a direction toward the redundant column, wherein the bit line input-output node of the column positioned adjacent to the redundant column is coupled to the redundant bit line.

11. The method of claim 10 wherein:

the memory array has a plurality of data inputs-outputs and at least one zone, and steps (a), (b), (c) and (d) are performed for each zone having a defective column;

the columns in each zone are arranged in a plurality of data input-output sets and the respective bit lines of the columns in each set are multiplexed into a respective one of the data inputs-outputs; and the identifying step (c) comprises defining a digital code value, which indicates whether the zone has a defective column, identifies the input-output set containing the defective column and identifies the column in the input-output set that is the defective column.

12. A memory array comprising:

a first zone of memory elements arranged in rows and columns, wherein each column in the first zone has a respective bit line;

a first redundant column of memory elements having a first redundant bit line;

a plurality of bit line input-output nodes which are each switchably coupled to either a respective one of the bit lines in the first zone or another one of the bit lines in the first zone, wherein one of the bit line input-output nodes is switchably coupled to either the respective bit line or the first redundant bit line; and a switching circuit for each of the columns in the first zone, wherein each switching circuit comprises:

a first switch coupled in series between the respective bit line input-output node and the respective bit line of the corresponding column; and a second switch coupled in series between the respective bit line input-output node and the bit line that is adjacent to the respective bit line in a direction toward the first redundant bit line.

13. The memory array of claim 12 wherein each switching circuit further comprises:

a first latch having a data output coupled to switch control terminals of the first and second switches in that switching circuit.

14. The memory array of claim 13 wherein the data output of the first latch comprises:

a first data output which is coupled to the switch control terminal of the first switch; and a second data output which is logically inverted relative to the first data output and is coupled to the switch control terminal of the second switch.

15. A memory array comprising:

a first zone of memory elements arranged in rows and columns, wherein each column in the first zone has a respective bit line;

a first redundant column of memory elements having a first redundant bit line;

a second redundant column of memory elements having a second redundant bit line, wherein the first and second redundant columns are positioned at opposite ends of the columns in the first zone; and a plurality of bit line input-output nodes which are each switchably coupled to either a respective one of the bit lines in the first zone or another one of the bit lines in the first zone, wherein one of the bit line input-output nodes is switchably coupled to either the respective bit line or the first redundant bit line, and wherein another of the bit line input-output nodes is switchably coupled to either the respective bit line or the second redundant bit line.

16. The memory array of claim 15 and further comprising a switching circuit for each of the columns in the first zone, wherein each switching circuit comprises:

a first switch coupled in series between the respective bit line input-output node and the respective bit line of the corresponding column;

a second switch coupled in series between the respective bit line input-output node and the bit line that is adjacent to the respective bit line in a direction toward the first redundant bit line; and a third switch coupled in series between the respective bit line input-output node and the bit line that is adjacent to the respective bit line in a direction toward the second redundant bit line.

17. The memory array of claim 16 wherein each switching circuit further comprises:

a first latch which controls the first and second switches in that switching circuit; and a second latch which controls the first and third switches in that switching circuit.

\* \* \* \* \*